United States Patent
Duggal et al.

(10) Patent No.: US 6,294,800 B1
(45) Date of Patent: Sep. 25, 2001

(54) PHOSPHORS FOR WHITE LIGHT GENERATION FROM UV EMITTING DIODES

(75) Inventors: Anil Raj Duggal, Niskayuna; Alok Mani Srivastava, Schenectady, both of NY (US); John Martin Davenport, Lyndhurst, OH (US); Thomas Frederick Soules, Richmond Heights, OH (US); William Winder Beers, Chesterland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/203,214

(22) Filed: Nov. 30, 1998

Related U.S. Application Data

(63) Continuation-in-part of application No. 09/144,134, filed on Aug. 31, 1998, now abandoned.
(60) Provisional application No. 60/073,982, filed on Feb. 6, 1998.

(51) Int. Cl.$^7$ .................................................. H01L 33/00
(52) U.S. Cl. ................................ 257/89; 257/98; 257/99; 257/100; 313/502; 313/503; 313/504; 313/512
(58) Field of Search ................................ 257/88, 89, 98, 257/99, 100; 313/501–504, 512

(56) References Cited

U.S. PATENT DOCUMENTS

| | | | |
|---|---|---|---|
| 3,922,233 | * 11/1975 | Torii et al. ............................. | 313/467 |
| 4,661,419 | 4/1987 | Nakamura ............................. | 428/691 |
| 5,198,679 | 3/1993 | Katoh et al. .......................... | 250/484 |
| 5,571,451 | 11/1996 | Srivastava et al. ........... | 252/301.4 R |
| 5,717,289 | * 2/1998 | Tanaka ................................. | 313/503 |
| 5,813,753 | * 9/1998 | Vriens et al. ......................... | 313/502 |
| 5,847,507 | 12/1998 | Butterworth et al. ............... | 313/512 |
| 5,851,063 | 12/1998 | Doughty et al. ..................... | 362/231 |
| 5,925,897 | 7/1999 | Oberman .............................. | 257/80 |
| 5,966,393 | 10/1999 | Hide et al. ............................ | 372/23 |
| 5,998,925 | 12/1999 | Shimizu et al. ..................... | 313/503 |
| 6,066,861 | 5/2000 | Höhn et al. .......................... | 257/99 |
| 6,069,440 | 5/2000 | Shimizu et al. ..................... | 313/486 |
| 6,084,250 | * 7/2000 | Justel et al. .......................... | 257/89 |

OTHER PUBLICATIONS

Qiang et al., Luminescence and energy transfer in Y2O3 co–doped with Bi 3+ and Eu 3+, Journal of Luminescence 28, 1983.*
Shionoya et al., Phosphor Handbook, 1998.*
S. Shionoya et al: Phosphor Handbook, pp. 168–170, 317–330, 343–349, 389–410, 412–417, 419–431, 554–555, 623–636, 727, 809 (Phosphor Research Society (1998).
S. Nakamura et al.: The Blue Laser Diode, pp. 216–221, 328–329 (Springer 1997).
Keith Butler: Fluorescent Lamp Phosphors, pp. 98–107 (The Pennsylvania State University Press 1980).
G. Blasse et al.: Luminescent Materials, pp. 109–110 (Springer–Verlag 1994).
Qiang et al., Luminescence and Energy Transfer in Y2O3 Co–Doped With Bi3+ and Eu3+, Journal of Luminescence 28 (1983) pp. 1–11, North–Holland Publishing Company.

* cited by examiner

Primary Examiner—Minh Loan Tran
(74) Attorney, Agent, or Firm—Toan P. Vo; Noreen C. Johnson

(57) ABSTRACT

$Ca_8Mg(SiO_4)_4Cl_2:Eu^{2+},Mn^{2+}$ and $Y_2O_3:Eu^{3+},Bi^{3+}$ are phosphors which have been sensitized to absorb ultraviolet radiation, such as from a light emitting diode, and to convert the radiation into visible light. A phosphor conversion material blend comprises $Ca_8Mg(SiO_4)_4Cl_2:Eu^{2+},Mn^{2+}$; $Y_2O_3:Eu^{3+},Bi^{3+}$, and known blue phosphors that absorb ultraviolet radiation from a LED and convert the radiation into visible bright white light. Also, a light emitting assembly comprises at least one of a red, green and blue phosphor for absorbing and converting ultraviolet radiation into visible light. A laser diode can be used to activate the phosphors to provide improved efficiency and brightness.

33 Claims, 5 Drawing Sheets

PHOSPHORS FOR WHITE LIGHT GENERATION FROM UV EMITTING DIODES

This application is a continuation-in-part (CIP) of U.S. Ser. No. 09/144,134, filed Aug. 31, 1998, now abandoned, which is hereby incorporated by reference in its entirety which claims priority to provisional application U.S. Ser. No. 60/073,982, filed Feb. 6, 1998, incorporated by reference in its entirety.

FIELD OF THE INVENTION

The invention relates to phosphors. In particular, the invention relates to phosphor compositions for light emitting diodes and laser diodes.

BACKGROUND OF THE INVENTION

Semiconductor light emitters are well known in the art. Semiconductor light emitters include light emitting diodes (LEDs) and semiconductor lasers. LEDs are devices of choice for many display applications because of advantages LEDs possess over other light sources. These advantages include a single relatively small size, a low operating current, a naturally colored light, a low power consumption, a long life, a maintained high efficiency (power in versus light output), an acceptable dispersal of light, and a relatively low cost of manufacture compared to other light sources.

Applications for LEDs include the replacement of light sources, such as incandescent lamps, especially where a colored light source is needed. LEDs are often used as display lights, warning lights and indicating lights. This colored light source application arises from a LED emitting radiation that produces an inherently colored light. The color of light emitted by a LED is dependent on the type of semiconductor material relied upon and its physical characteristics. The LED has not been acceptable for lighting uses where a bright white light is needed, due to the inherent color.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its un-excited (lower) energy state, emits a photon. The photon corresponds to an energy difference between the excited state and lower energy state, and results in an emission of radiation. The methods for exciting electrons vary for semiconductor light emitters, however, one method is excitation by the well-known method of injection electroluminescence.

Semiconductors are generally classified into three types, p-type, n-type and intrinsic semiconductors. Intrinsic semiconductors comprise either p-type or n-type semiconductors, and are formed by introducing impurities (dopants) of p-type (donor) or n-type (acceptor), respectively. In an n-type semiconductor, electron conduction (negative charge) exceeds acceptor hole (absence of electrons) concentration and electronic conduction is by donor electrons. In a p-type semiconductor, the hole concentration exceeds the electrons, and conduction is by acceptor holes.

Semiconductor light emitting devices are essentially characterized by p-type material and n-type material having a pn-junction there between or within p-type and n-type material regions. At equilibrium, no light is emitted by the semiconductor light emitting device. If electrons from the n-type material are coaxed into the conduction band over holes of the p-type material, electrons are excited. Electrons, once excited, will relax from their excited energy level at the conduction band to the valence band. The relaxation results in radiation (photon) emission. The radiation is normally ultraviolet radiation with about a 370 nm wavelength, which is not visible to the human eye. Radiation to be visible light must possess a wavelength within the visible spectrum. Phosphors are commonly used to convert non-visible radiation into visible radiation.

The use of phosphors has been attempted for converting LED radiation into visible light. LEDs, which include one or more phosphors for converting radiation into a "white" light merely produce a yellow-whitish light. For example, one yellow-whitish light emitting LED comprises a blue-light emitting LED, which has an emission wavelength equal to about 450 nm, provided with a yellow-light emitting phosphor, such as for example $Y_3Al_5O_{12}$—$Ce^{3+}$, (YAG-Ce). The yellow-light emitting phosphor absorbs radiation emitted from the LED, and converts the absorbed radiation to a yellow-whitish light. The yellow-whitish light of the above example is produced with a relatively low efficiency (energy in versus energy out), for example only in a range between about 60% to about 80%. The yellow-whitish light, while suitable for limited applications, fails in applications where a true bright white light of high intensity and brightness is desired.

Color temperature is a standard used to compare the color of various light, for example fluorescent, incandescent, and other light types. Color temperature is related to a temperature of a black body that would give an equivalent tone of white light. In general, a lower color temperature is indicative of a redder tone of the white light. Conversely, a higher color temperature is indicative of a bluer tone of white light. There is no individual specific lamp component having a temperature equal to or determinative of the color temperature. For the yellow-whitish light described above, the color temperature falls in a range between about 6000 Kelvin to about 8000 Kelvin, with a resultant a color rendering index (CRI) less than about 85. The lumens per watt (LPW) of the above-described LED are in a range of about 5 LPW to about 10 LPW.

LED radiation at about 5 LPW to about 10 LPW with a CRI less than about 85 is not acceptable for lighting applications. Most lighting applications require a LPW that is at least 15 LPW, with a CRI maintained at or above 85, to increase the light source efficiency. Further, known LED light sources do not provide a single LED with a sufficient LPW and CRI for most generalized lighting applications, especially for white light.

Blue and green light emitting LEDs have been difficult to develop, even though acceptable yellow and red light emitting LEDs are well-known. Green and blue light emitting LEDs are limited because they possess several undesirable shortcomings. These green and blue LEDs possess a low intensity, brightness, and power, so their lights are not sharp and bright, nor are they high-quality (possessing wavelengths at or near the mid-point of the wavelength range for a particular color). Further, their emitted lights are not tuned at wavelengths to be combined with other light sources, such as red, to provide a bright white light. Accordingly, LED usage is severely limited, and not usable in place of compact fluorescent lamps, emergency lights, exit signs and the like.

Therefore, a single source LED that produces a bright white light is needed. Also, a blue-light emitting LED and a green-light emitting phosphors are needed for phosphor conversion material blends to produce a bright white light.

SUMMARY OF THE INVENTION

Accordingly, the invention provides a LED that overcomes the above-noted deficiencies. The invention also provides phosphors that produce light, that when combined with other lights, produce a bright white light.

In accordance with one embodiment of the invention, $Ca_8Mg(SiO_4)_4Cl_2:Eu^{2+},Mn^{2+}$ absorbs ultraviolet radiation from a light emitting diode and converts the radiation into visible light.

In a further embodiment of the invention a phosphor, $Y_2O_3:Eu^{3+},Bi^{3+}$ absorbs ultraviolet radiation from a light emitting diode and converts the radiation into visible light.

Yet another embodiment of the invention is a phosphor conversion material blend comprising green, red and blue phosphors that absorb ultraviolet radiation from a light emitting diode, and convert the radiation into visible bright white light. The green phosphor comprises $Ca_8Mg(SiO_4)_4Cl_2:Eu^{2+},Mn^{2+}$, the red phosphor comprises $Y_2O_3:Eu^{3+},Bi^{3+}$, and blue phosphor comprises known blue phosphors, such as $(Sr,Ba,Ca)_5(PO_4)_3Cl:Eu^{2+}$ and $BaMg_2Al_{16}O_{27}:Eu^{2+}$.

Furthermore, another embodiment of the invention provides a LED including a phosphor comprising $Ca_8Mg(SiO_4)_4Cl_2:Eu^{2+},Mn^{2+}$ capable of absorbing ultraviolet radiation and converting the radiation into a green visible light.

In a yet further embodiment of the invention, a LED includes a phosphor comprising $(Sr,Ba,Ca)_5(PO_4)_3Cl:Eu^{2+}$ and $BaMg_2Al_{16}O_{27}:Eu^{2+}$ capable of absorbing ultraviolet radiation and converting the radiation into blue visible light.

In a still further embodiment of the invention, a LED includes a phosphor comprising $Y_2O_3:Eu^{3+},Bi^{3+}$ capable of absorbing ultraviolet radiation and converting the radiation into red visible light.

Another embodiment of the invention provides a LED with a phosphor conversion material blend that comprises $Ca_8Mg(SiO_4)_4Cl_2:Eu^{2+},MN^{2+}, Y_2O_3:Eu^{3+},Bi^{3+}$, and $(Sr,Ba,Ca)_5(PO_4)_3Cl:Eu^{2+}$ and $BaMg_2Al_{16}O_{27}:Eu^{2+}$ to absorb ultraviolet radiation from a light emitting diode and convert the radiation into visible bright-white light.

According to another embodiment of the invention, a lamp is provided which comprises a laser diode which emits radiation, a transmissive body fixed to the laser diode through which radiation from the laser diode propagates, and at least one phosphor fixed with respect to the transmissive body which converts the radiation to radiation of a different wavelength. The transmissive body may comprise a glass or plastic material which encapsulates the laser diode, wherein the phosphor is formed on a surface of the transmissive body. The lamp may further comprise a plurality of scattering particles dispersed within the transmissive body to scatter the radiation emitted from the laser diode.

The invention also relates to a method of producing light comprising the steps of generating radiation with a semiconductor laser diode, and converting at least a portion of the radiation to a different wavelength with at least one phosphor.

These and other aspects, advantages and salient features of the invention will become apparent from the following detailed description, which, when taken in conjunction with the annexed drawings, where like reference characters indicate the elements, disclose embodiments of the invention.

DETAILED DESCRIPTION OF THE INVENTION

Figure 1:
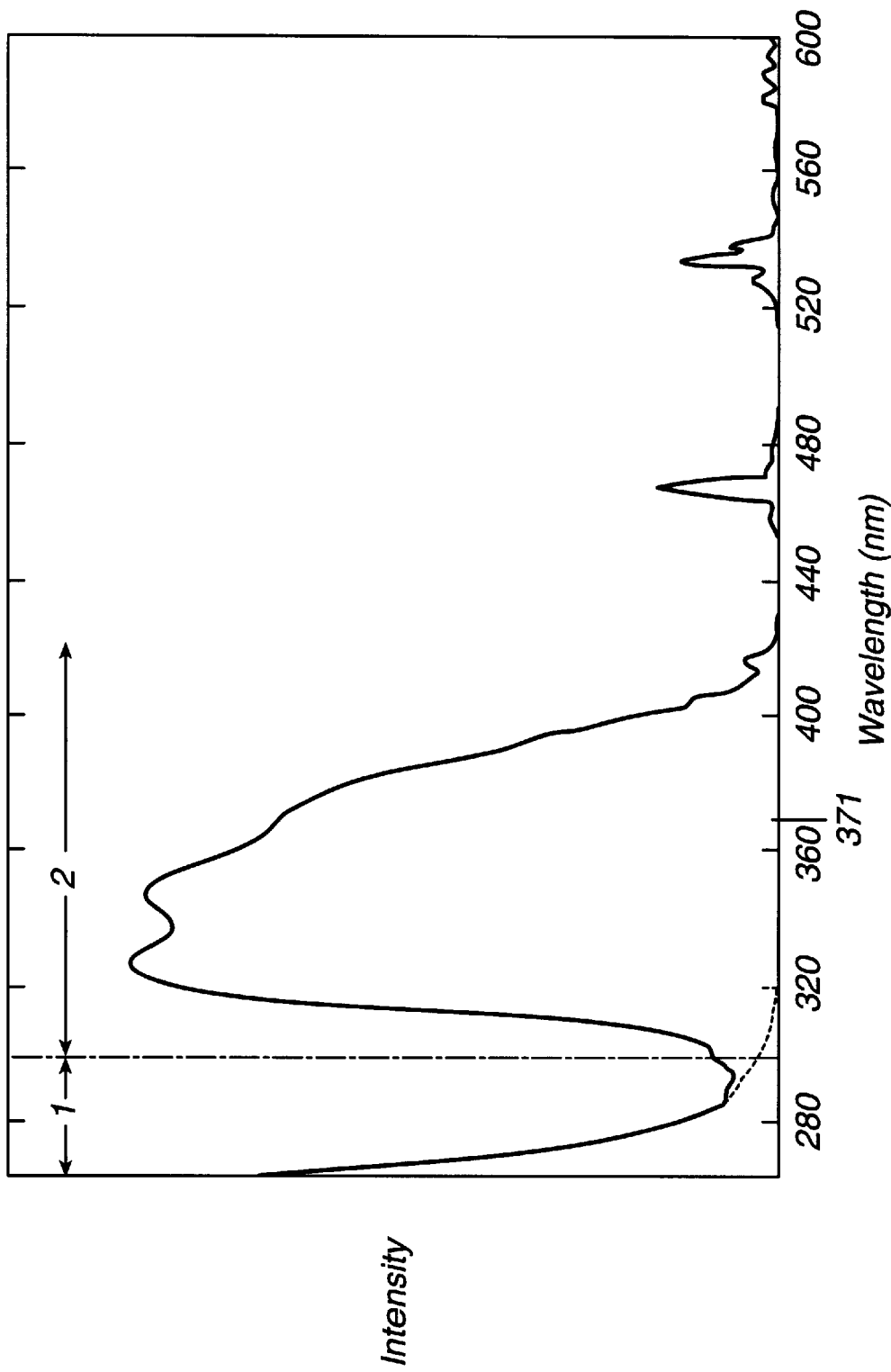
FIG. 1 is a graph of intensity versus wavelength for the absorption of light by a red phosphor.

Phosphors convert radiation (energy) to visible light. Different combinations of phosphors provide different colored light emissions. The colored light that originates from the phosphors provides a color temperature.

A fluorescent lamp conversion phosphor material blend (material blend) converts generated radiation to visible light. A blend material is used regardless of the desired intensity and "color" of the desired fluorescent light. The fluorescent light color is dependent on the particular components of the material blend. The material blend may include more of one basic color emitting phosphors, for example a particular mix with more of one of red, green and blue phosphors to emit a desired color (tint) of light.

Fluorescent lamp material blends absorb radiation with a wavelength at about 254 nm (ultraviolet). The radiation is produced by exciting photons, normally generated by mercury plasma, as is known in fluorescent lamps. Thus, the fluorescent light is produced by the material blend absorbing radiation and subsequently emitting visible light. The known fluorescent lamp material blends do not successfully convert radiation from other sources into useful visible light. The failure is due, at least in part, to the material blend being specifically developed to convert radiation at about 254 nm to visible light. These known material blends do not contain appropriate materials to efficiently absorb radiations with a wavelength other than about 254 nm.

LEDs do not emit radiation in a wavelength that can be converted into visible light by known fluorescent material blends. For example, some LEDs emit radiation generally in a wavelength of about 370 nm. Energy at this wavelength will not be converted by known material blends into useful visible light.

It was determined that a LED that produces a bright-white light would be useful to give desirable qualities of LEDs as light sources. Therefore, in one embodiment of the invention, phosphors for a luminescent material phosphor conversion material blend (phosphor conversion material blend) are provided to convert radiation from a LED into visible light. Further, it was determined that phosphors that convert LED radiation and emit a high-quality colored light (light with a wavelength approximately at a center of a wavelength range for a particular color) are useful. The individual phosphors and a phosphor conversion material blend including the individual phosphors convert radiation at a specified wavelength, for example radiation at about 370 nm as emitted by a LED, into visible light. The visible light when provided by phosphor conversion material blend comprises a bright white light with high intensity and brightness.

In the following discussion, the wavelength of the radiation of the radiation source, such as a LED, is described at about 370 nm. This is merely exemplary of the wavelengths from a LED radiation source. For example, a LED radiation within the scope of the invention is in a range between about 330 nm to about 420 nm, such as in a range between about 350 nm to about 400 nm. Also, a LED radiation, within the scope of the invention, is in a range between about 365 nm to about 375 nm, for example at about 370 nm. Also, the radiation source is described as an LED, however, this is merely exemplary and not meant to limit the invention in any way. Other semiconductor radiation sources emitting similar radiations, such as, but not limited to, semiconductor lasers, are within the scope of the invention.

Phosphor conversion material blends for LEDs comprise rare earth-activated phosphors. These rare earth-activated phosphors convert LED radiation at about 370 nm to visible light. Known phosphors are poor absorbers of 370 nm radiation. The poor absorption is overcome by incorporating suitable sensitizers (activators) into the phosphors. The sensitizers comprise ions that are incorporated into the phosphors, absorb radiation at about 370 nm radiation, and then transfer the absorbed radiation to emitting ions. After the absorbed and transferred radiation reaches ions, the radiation is converted and radiated as visible light.

One phosphor conversion material blend for a LED, as embodied by the invention, comprises $Y_2O_3:Eu^{3+},Bi^{3+}$, as a red-light emitting component; $Ca_8Mg(SiO_4)_4Cl_2:Eu^{2+},Mn^{2+}$ as a green light emitting component; in combination with a blue-light emitting phosphor, for example at least one of SECA $((Sr,Ba,Ca)_5(PO_4)_3Cl:Eu^{2+})$ and BAM $(BaMg_2Al_{16}O_{27}:Eu^{2+})$ phosphors. These three phosphors in a phosphor conversion material blend generate bright white light with high intensity and brightness from LED radiation. A phosphor conversion material blend, in accordance with an exemplary composition of an embodiment of the invention, comprises red phosphors provided in a range between about 40% to about 80%, green phosphors provided in a range between about 20% to about 50%, and blue phosphors provided in a range between about 5% and about 25%, all weight percent. The amount of each respective phosphor is dependent on the desired color temperature of the light.

SECA and BAM phosphors are known in the art and described in U.S. Pat. Nos. 4,786,841 to Fohl et al. and 4,075,532 to Piper et al., respectively. Accordingly, a further description of these well-known phosphors is omitted.

$Y_2O_3:Eu^{3+},Bi^{3+}$ phosphor, as embodied by the invention, emits red light. Non-sensitized $Y_2O_3:Eu^{3+}$ is a known fluorescent lamp phosphor and exhibits a near unity quantum efficiency (a ratio of a number of photons emitted over a number of photons absorbed) for radiation at about 254 nm. However, since this red-light emitting fluorescent phosphor does not satisfactorily absorb LED radiation at about 370 nm, it does not convert LED radiation to visible light.

Therefore, $Bi^{3+}$ is added to $Y_2O_3:Eu^{3+}$ phosphor as a sensitizer. This sensitizer provides for the absorption of the 370 nm radiation. Also, the $Bi^{3+}$ sensitizer enhances transfer of incident excitation radiation and generates an efficient red-light emission well within the red light spectrum.

FIG. 1 illustrates a graph of absorption of radiation by $Y_2O_3:Eu^{3+},Bi^{3+}$. The solid curve in FIG. 1 illustrates absorption of radiation by $Y_2O_3:Eu^{3+},Bi^{3+}$. The continued dashed curve illustrates absorption of $Y_2O_3:Eu^{3+}$ without a $Bi^{3+}$ sensitizer. As illustrated, $Y_2O_3:Eu^{3+}$ does not absorb radiation with a wavelength of about 370 nm. The curve at area 2 illustrates absorption of LED 370 nm radiation by $Y_2O_3:Eu^{3+}$, $Bi^{3+}$. As illustrated, the $Bi^{3+}$ sensitizer provides an absorption peak at wavelengths including 370 nm, as emitted by a LED.

Figure 2:
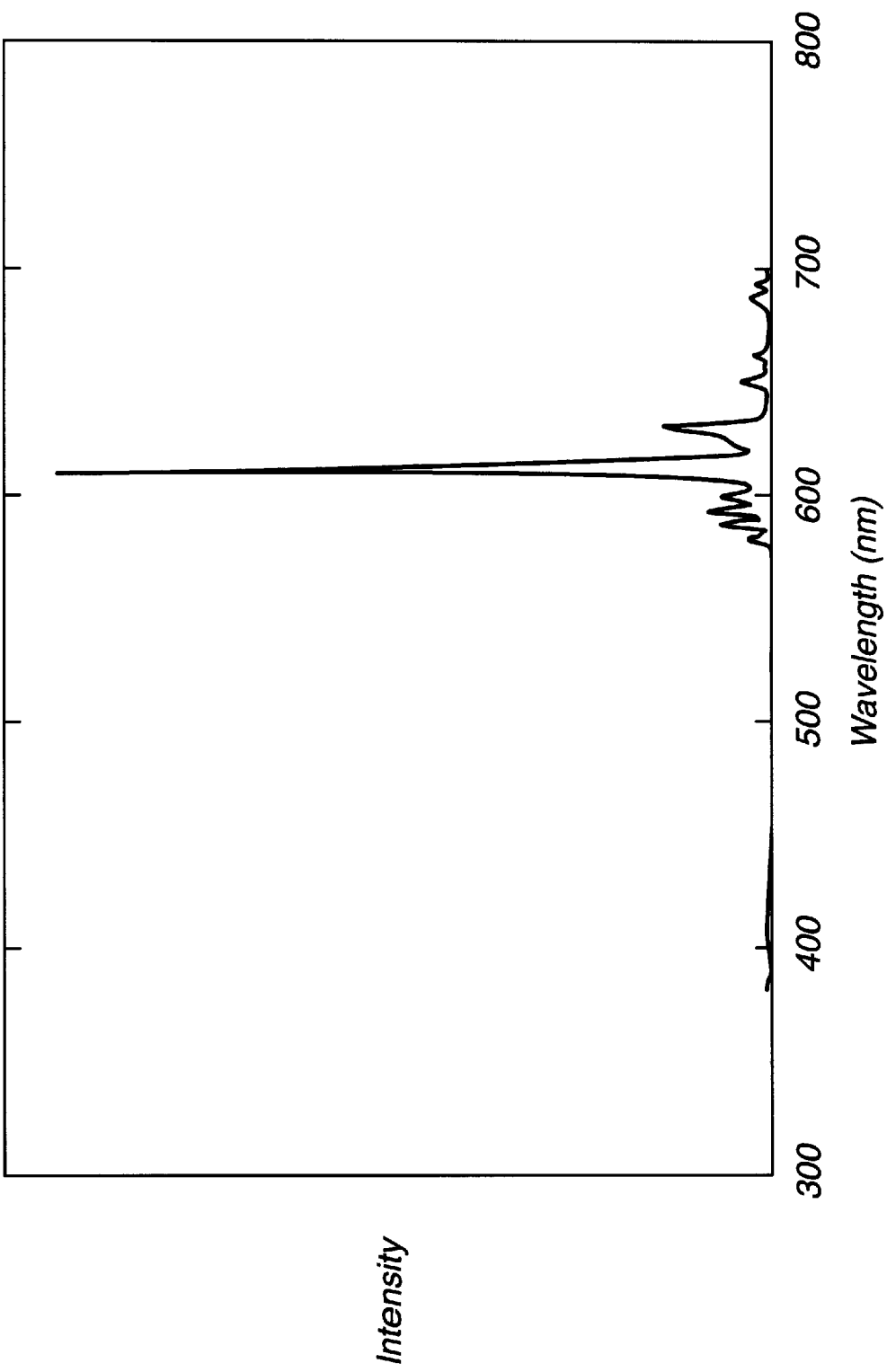
FIG. 2 is a graph of intensity versus wavelength for the emission of light by a red phosphor.

FIG. 2 illustrates a graph of the emission of $Y_2O_3:Eu^{3+}$, $Bi^{3+}$. The emission of $Y_2O_3:Eu^{3+},Bi^{3+}$ provides a wavelength peak corresponding to high-quality red light. Accordingly, the $Y_2O_3:Eu^{3+},Bi^{3+}$ adequately and satisfactorily absorbs LED ultraviolet radiation at about 370 nm and converts at into high quality red visible light.

A known green-light emitting fluorescent phosphor comprises $Ca_8Mg(SiO_4)_4Cl_2:Eu^{2+}$. $Ca_8Mg(SiO_4)_4Cl_2:Eu^{2+}$ does not produce a high-quality green light. The $Ca_8Mg(SiO_4)_4Cl_2:Eu^{2+}$ emits a greenish-tinted light with a wavelength at about 500 nm to about 505 nm, which is on a low side of a green light spectrum. While this greenish-tinted light is acceptable for some applications, visible light in this range is inadequate for true green light applications. Also, the greenish-tinted light cannot be combined with other produced light to produce a bright white light with high intensity and brightness.

Figure 3:
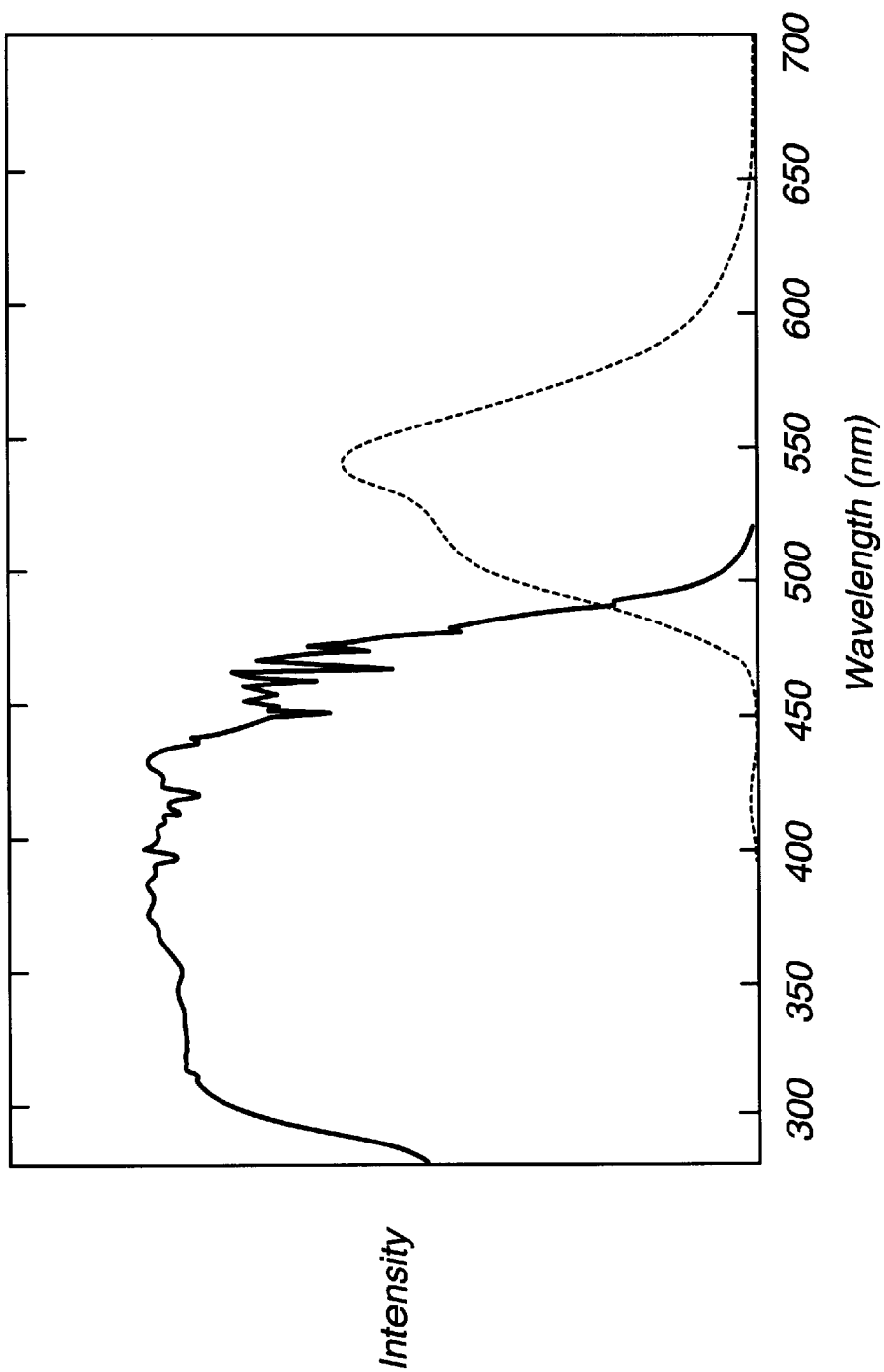
FIG. 3 is a graph of intensity versus wavelength for the absorption of light by a green phosphor.

FIG. 3 is an illustration of a graph of absorption and emission by $Ca_8Mg(SiO_4)_4Cl_2:Eu^{2+},Mn^{2+}$. The solid curve in FIG. 3 indicates absorption by $Ca_8Mg(SiO_4)_4Cl_2:Eu^{2+}$, $Mn^{2+}$. The dashed curve in FIG. 3 (toward the right side) indicates emission by $Ca_8Mg(SiO_4)_4Cl_2:Eu^{2+},Mn^{2+}$, where the emission includes 540 nm, and exhibits a clear high quality green light.

Figure 4:
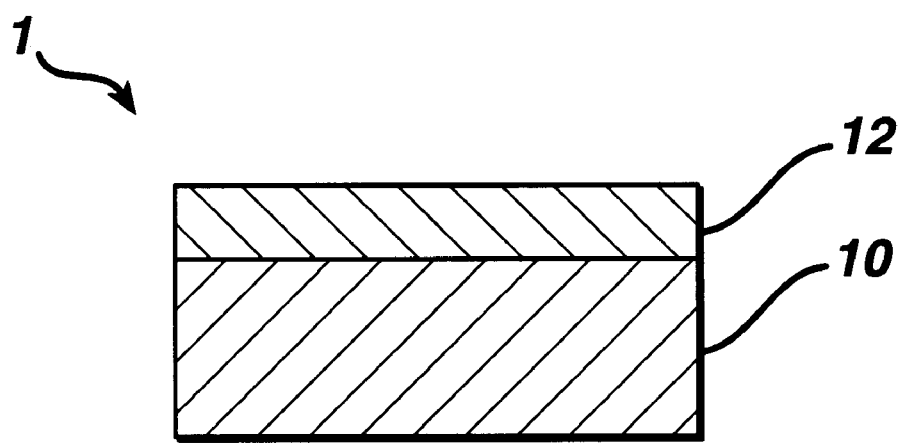
FIG. 4 illustrates an example of an light emitting assembly.

FIG. 4 illustrates an exemplary light emitting assembly 1, in accordance with one embodiment of the invention. The light emitting assembly 1 comprises a semiconductor ultraviolet radiation source, such as a phosphor conversion LED 10, and a phosphor conversion material blend 12. The phosphor conversion material blend 12 is radiationally coupled to the LED 10 to receive radiation from the LED 10. Radiationally coupled means that the elements are associated with each other so radiation from one is transmitted to the other. The phosphor conversion material blend 12 is deposited on the LED 10 by any appropriate method, such as, but not limited to, applying the red, green, and blue phosphors together. For example, a water based suspension of the three phosphors can be formed, and applied to a LED surface. This method is merely exemplary of possible positionings of the phosphor conversion material blend 12 and LED 10. Alternatively, the phosphor conversion material blend 12 can be placed on a cover, lens or other optical feature associated with the LED 10 to absorb and convert energy as long as the phosphor conversion material blend 12 is radiationally coupled to the LED 10.

The phosphor conversion material blend 12 comprises separate blue, green, and red phosphors. The separate phosphors are provide in ranges to provide a bright white light with high intensity and brightness. For example, one phosphor conversion material blend 12, as embodied by the invention, comprises $Y_2O_3:Eu^{3+},Bi^{3+}$, as a red-light emitting component; $Ca_8Mg(SiO_4)_4Cl_2:Eu^{2+,Mn2+}$ as a green light emitting component; and a blue-light emitting phosphor. The blue-light emitting phosphor comprises at least one phosphor selected from one of SECA $(Sr,Ba,Ca)_5(PO_4)_3Cl:Eu^{2+}$ and BAM $(BaMg_2Al_{16}O_{27}:Eu^{2+})$ phosphors.

Visible-light obtained from a single LED comprising the above-disclosed phosphor conversion material blend, provides a bright white light. For example, the resultant bright white light with high intensity and brightness possess a color temperature at about 4100K and a CRI of about 85. With a LED efficiency of about 12%, the LED will produce about 20 LPW. Further, with a color temperature at about 5000K, a CRI of at least about 86 is obtained with about a 20 LPW. Therefore, a single LED with a phosphor conversion material blend, as embodied by the invention, provides a superior LPW, for example at least about 20 LPW and preferably at least about 25 LPW, with a CRI of at least 84 or greater.

Figure 5:
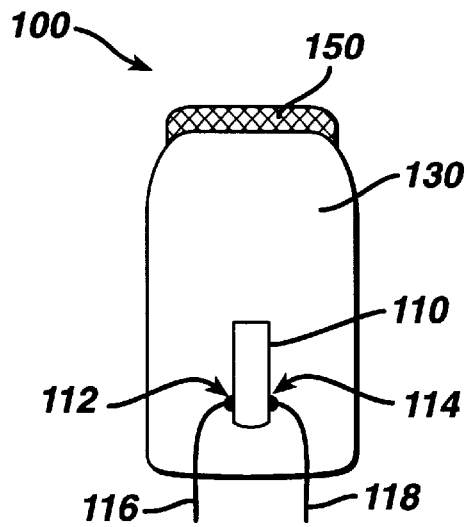
FIG. 5 illustrates a lamp according to an exemplary embodiment of the invention.

FIG. 5 illustrates a lamp according to another embodiment of the invention. As shown in FIG. 5, the lamp 100 includes a light source 110, a transmissive body 130, and a luminescent material 150 which typically comprises at least one phosphor. The light source 110 may be a laser diode, for example, which includes positive and negative contacts 112, 114, respectively. The positive and negative contacts supply electric current to the light source 110 via leads 116, 118. The light source 110, the contacts 112, 114, and a portion of the leads 116, 118 are encapsulated in the transmissive body 130, which may comprise a material such as plastic, glass, or silicone which is transmissive to radiation in the visible and UV wavelengths. The transmissive body 130 is preferably chemically stable in the presence of UV radiation.

The light source 110 preferably emits light in the UV wavelengths, for example light having a wavelength of 350–450 nanometers (nm), typically in a range of 350–400 nm, for example 370 nm. Examples of laser diodes which emit UV or blue radiation are described, for example, in U.S. Pat. Nos. 5,604,763 and 5,644,584. Laser diodes and LEDs which emit UV and blue radiation are also described in Shuji Nakamura and Gerhard Fasol, "The Blue Laser Diode" (1997).

Typically, with a UV laser diode as the light source 110, a combination of three phosphors, red, green, and blue is employed. An example of a suitable phosphor which absorbs UV radiation and emits red light is: $Y_2O_3:Eu^{3+},Bi^{3+}$. Examples of phosphors which absorb UV radiation and emit green light include: $Ca_8Mg(SiO_4)_4Cl_2:Eu^{2+},Mn$ 2; $Ba_2SiO_4:Eu^{2+}$; $Ba_2(Mg,Zn)Si_2O_7:E^{2+}$; and $(Ba,Sr)Al_2O_4:Eu^{2+}$. Phosphors which absorb UV radiation and emit blue light include: $(Ba,Sr,Ca)_5(PO_4)_3Cl:Eu^{2+}$; $BaMg_2Al_{16}O_{27}:Eu^{2+}$ and $BaMgAl_{10}O_{17}:Eu^{2+}$.

The phosphors are typically in the form of a powder. A mixture of red, green and blue emitting phosphors is prepared and applied to the outside of the transmissive body 130, for example with a water-based suspension of the phosphors. After removal of the liquid component of the suspension, a protective transparent outer layer such as silicone may be applied over the phosphor layer. The phosphor layer may have a thickness of about 16–30 microns, for example.

The relative proportion of red, green, and blue emitting phosphors is typically about 50–70 weight percent red, 25–40 weight percent green, and 5–20 weight percent blue.

Figure 6:
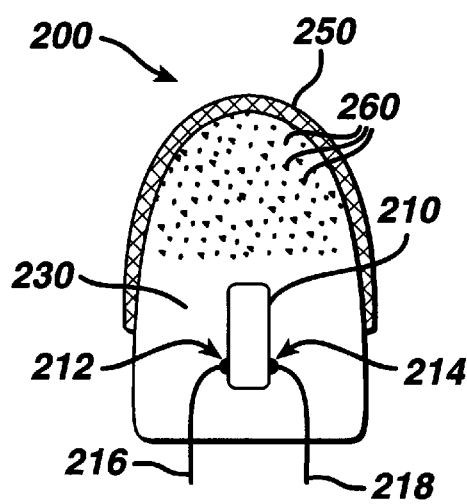
FIG. 6 illustrates a lamp which includes a laser diode according to another embodiment of the invention.

FIG. 6 illustrates a lamp according to another embodiment of the invention. As shown in FIG. 6, the lamp 200 includes a laser diode 210, a transmissive body 230, and a luminescent material 250. The laser diode includes positive and negative contacts 212, 214, respectively, which supply electric current to the laser diode 210 via leads 216, 218. The laser diode 210, the contacts 212, 214, and a portion of the leads 216, 218 are encapsulated in the transmissive body 230, which may comprise a plastic, glass or silicone material which is transmissive in the visible and UV wavelengths.

The lamp 200 also includes a plurality of scattering particles 260 which are embedded in the transmissive body 230. The scattering particles may comprise $Al_2O_3$ particles such as CR30 alumina powder available from Baikowski. The scattering particles may also comprise $TiO_2$ particles, for example. The particles 260 effectively scatter the coherent light emitted from the laser diode 210, preferably with a negligible amount of absorption. The coupling of the diffuse scattered laser light with the luminescent material is advantageous in reducing optical saturation effects and physical damage of the luminescent material.

A luminescent material 250 such as a phosphor is typically formed on an outside surface of the transmissive body 230. The luminescent material 250 may cover substantially all of the outside surface of the transmissive body 230. The luminescent material 250 may comprise at least one phosphor, as disclosed above, which absorbs UV radiation and emits red, green, or blue light. The combination of red, green and blue light produces white light.

Figure 7:
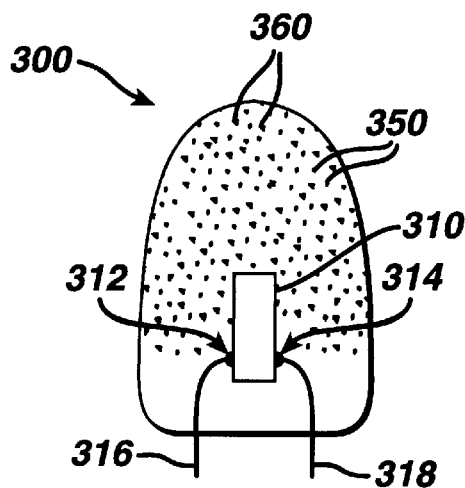
FIG. 7 illustrates a lamp which includes a laser diode according to another embodiment of the invention.

FIG. 7 illustrates a laser diode lamp according to another embodiment of the invention. As shown in FIG. 3, the lamp 300 includes a laser diode 310 and a transmissive body 330. The laser diode 310 includes positive and negative contacts 312, 314, respectively, which supply electric current to the laser diode 310 via leads 316, 318. The laser diode 310, the contacts 312, 314, and a portion of the leads 316, 318 are encapsulated in the transmissive body 330, which may comprise a plastic, glass, or silicone material which is transmissive in the visible and UV wavelengths.

The lamp 300 also includes both luminescent particles 350 and scattering particles 360. The luminescent particles 350 may comprise one or more powdered phosphor materials, as described above, which absorb the UV light emitted from the laser diode 310 and emit light of a longer wavelength, e.g. red, green, and/or blue. The scattering particles 360 may comprise $TiO_2$ or $Al_2O_3$ powder, for example.

The embodiments shown in FIGS. 5–7 which include a laser diode typically have a large efficacy and operate at a high optical power. The laser diode has a high efficacy and optical power because it relies on stimulated rather than spontaneous emission, which reduces absorption losses. In addition, since most of the light is emitted normal to the surface of a laser diode, internal reflection losses are reduced.

Other embodiments of the invention will be apparent to those skilled in the art from a consideration of this specification or practice of the invention disclosed herein. It is intended that the specification and examples be considered as exemplary only, with the scope and spirit of the invention being defined by the following claims.

What is claimed is:

1. A composition of matter comprising $Ca_8Mg(SiO_4)_4Cl_2:Eu^{2+},Mn^{2+}$.

2. The composition of matter according to claim 1 further comprising:
   at least one red light emitting phosphor and
   at least one blue light emitting phosphor;
   the composition of matter capable of converting a radiation to visible light, the radiation having a wavelength in a range from ultraviolet to blue.

3. The composition of matter according to claim 2 wherein said wavelength is in a range from about 330 nm to about 420 nm.

4. The composition of matter according to claim 2 wherein said wavelength is in a range from about 350 nm to about 400 nm.

5. The composition of matter according to claim 2 wherein said wavelength is in a range from about 355 nm to about 365 nm.

6. A phosphor conversion material blend composition that is capable of converting ultraviolet radiation to visible light, the phosphor conversion material blend composition comprising:
   at least one red light emitting phosphor;
   at least one green light emitting phosphor; and
   at least one blue light emitting phosphor;
   wherein the green light emitting phosphor comprises $Ca_8Mg(SiO_4)_4Cl_2:Eu^{2+},Mn^{2+}$; the red light emitting phosphor comprises $Y_2O_3:Eu^{3+},Bi^{3+}$; and the blue light emitting phosphor comprises at least one material selected from the group consisting of $(Sr,Ba,Ca)_5(PO_4)_3Cl:Eu^{2+}$ and $BaMg_2Al_{16}O_{27}:Eu^{2+}$.

7. A phosphor conversion material blend composition that is capable of converting ultraviolet radiation to visible light, the phosphor conversion material blend composition comprising:
   at least one red light emitting phosphor;
   at least one green light emitting phosphor; and
   at least one blue light emitting phosphor,
   wherein the green light emitting phosphor comprises $Ca_8Mg(SiO_4)_4Cl_2:Eu^{2+},Mn^{2+}$; the red light emitting phosphor comprises $Y_2O_3:Eu^{3+},Bi^{3+}$, and the blue light emitting phosphor comprises at least one material selected from the group consisting of $(Sr,Ba,Ca)_5(PO_4)Cl:Eu^{2+}$ and $BaMg_2Al_{16}O_{27}:Eu^{2+}$, and
   wherein the $Y_2O_3:Eu^{3+},Bi^{3+}$ is provided in a range between about 40% to about 80% by weight;
      the $Ca_8Mg(SiO_4)_4Cl_2:Eu^{2+},Mn^{2+}$ is provided in a range between about 20% to about 50% by weight; and
      the at least one material selected from the group consisting of $(Sr,Ba,Ca)_5(PO_4)_3Cl:Eu^{2+}$ and $BaMg_2Al_{16}O_{27}:Eu^{2+}$ is provided in a range between 5% and about 25% by weight.

8. A light emitting diode comprising:
   a semiconductor ultraviolet radiation source; and
   a phosphor comprising $Ca_8Mg(SiO_4)_4Cl_2:Eu^{2+},Mn^{2+}$ radiationally coupled to the semiconductor ultraviolet radiation source;
   wherein the $Ca_8Mg(SiO_4)_4Cl_2:Eu^{2+},Mn^{2+}$ is capable of absorbing ultraviolet radiation emitted by the semiconductor ultraviolet radiation source and converting the ultraviolet radiation into a green visible light.

9. The light emitting diode according to claim 8 further comprising
   a phosphor comprising $Y_2O_3:Eu^{3+},Bi^{3+}$ radiationally coupled to the semiconductor to the semiconductor ultraviolet radiation source;
   wherein the $Y_2O_3:Eu^{3+},Bi^{3+}$ is capable of absorbing ultraviolet radiation emitted by the semiconductor ultraviolet radiation source and converting the ultraviolet radiation into a red visible light.

10. The light emitting diode according to claim 8 further comprising
   a phosphor comprising at least one material selected from the group consisting of $(Sr,Ba,Ca)_5(PO_4)_3Cl:Eu^{2+}$ and $BaMg_2Al_{16}O_{27}:Eu^{2+}$ radiationally coupled to the semiconductor to the semiconductor ultraviolet radiation source;
   wherein the at least one material selected from the group consisting of $(Sr,Ba,Ca)_5(PO_4)_3Cl:Eu^{2+}$ and $BaMg_2Al_{16}O_{27}:Eu^{2+}$ is capable of absorbing ultraviolet radiation emitted by the semiconductor ultraviolet radiation source and converting the ultraviolet radiation into a blue visible light.

11. The light emitting diode according to claim 8 further comprising
   a phosphor conversion material blend composition comprising:
   a phosphor which is capable of absorbing ultraviolet radiation emitted by the semiconductor ultraviolet radiation source and converting the ultraviolet radiation into a red visible light; and
   a phosphor which is capable of absorbing ultraviolet radiation emitted by the semiconductor ultraviolet radiation source and converting the ultraviolet radiation into a blue visible light.

12. The light emitting diode according to claim 11 wherein the phosphor which is capable of absorbing ultraviolet radiation emitted by the semiconductor ultraviolet radiation source and converting the ultraviolet radiation into a red visible light comprises $Y_2O_3:Eu^{3+},Bi^{3+}$.

13. The light emitting diode according to claim 11 wherein the phosphor which is capable of absorbing ultraviolet radiation emitted by the semiconductor ultraviolet radiation source and converting the ultraviolet radiation into a blue visible light comprises at least one material selected from the group consisting of $(Sr,Ba,Ca)_5(PO_4)_3Cl:Eu^{2+}$ and $BaMg_2Al_{16}O_{27}:Eu^{2+}$.

14. The light emitting diode according to claim 11 wherein the phosphor conversion material blend composition absorbs ultraviolet radiation emitted by the semiconductor ultraviolet radiation source and converts the ultraviolet radiation into white visible light to provide a light source having a light output of at least 20 lumens per watt.

15. The light emitting diode according to claim 11 wherein the phosphor conversion material blend composition absorbs ultraviolet radiation emitted by the semiconductor ultraviolet radiation source and converts the ultraviolet radiation into white visible light to provide a light source having a color rendering index of at least 84.

16. A light emitting diode comprising:
   a semiconductor ultraviolet radiation source; and
   a phosphor conversion material blend composition, wherein the phosphor conversion material composition absorbs ultraviolet radiation emitted by the semiconductor ultraviolet radiation source and converts the ultraviolet radiation into white visible light, and wherein the composition comprises:
   $Ca_8Mg(SiO_4)_4Cl_2:Eu^{2+},Mn^{2+}$ radiationally coupled to the semiconductor ultraviolet radiation source;
   $Y_2O_3:Eu^{3+},Bi^{3+}$ radiationally coupled to the semiconductor ultraviolet radiation source; and
   at least one of $(Sr,Ba,Ca)_5(PO_4)_3Cl:Eu^{2+}$ and $BaMg_2Al_{16}O_{27}:Eu^{2+}$ radiationally coupled to the semiconductor ultraviolet radiation source; wherein the composition is capable of absorbing ultraviolet source and converting the ultraviolet radiation into visible light.

17. A light emitting diode comprising:
   a semiconductor ultraviolet radiation source; and
   a phosphor conversion material blend composition, wherein the phosphor conversion material composition absorbs ultraviolet radiation emitted by the semiconductor ultraviolet radiation source and converts the ultraviolet radiation into white visible light, and wherein the composition comprises:
   $Ca_8Mg(SiO_4)_4Cl_2:Eu^{2+},Mn^{2+}$ radiationally coupled to the semiconductor ultraviolet radiation source;
   $Y_2O_3:Eu^{3+},Bi^{3+}$ radiationally coupled to the semiconductor ultraviolet radiation source; and at least one of $(Sr,Ba,Ca)_5(PO_4)_3Cl:Eu^{2+}$ and $BaMg_2Al_{16}O_{27}:Eu^{2+}$ radiationally coupled to the semiconductor ultraviolet radiation source; wherein the composition is capable of absorbing ultraviolet source and converting the ultraviolet radiation into visible light;

and wherein the $Y_2O_3:Eu^{3+}$, $Bi^{3+}$ is provided in a range between about 40% to about 80% by weight;

the $Ca_8Mg(SiO_4)_4Cl:Eu^{2+},Mn^{2+}$ is provided in a range between about 20% to about 50% by weight; and the at least one of $(Sr,Ba,Ca)_5(PO_4)_3Cl:Eu^{2+}$ and $BaMg_2Al_{16}O_{27}:Eu^{2+}$ is provided in a range between about 5% to about 25% by weight.

18. A light source comprising:

a semiconductor radiation source which emits radiation;

a transmissive body which contains a plurality of scattering particles, which scatter the radiation, formed adjacent to the semiconductor radiation source through which the radiation from the semiconductor radiation source propagates;

at least one luminescent material formed adjacent to the transmissive body, the at least one luminescent material converting the radiation emitted from the semiconductor radiation source to radiation of a different wavelength.

19. The light source of claim 18, wherein the semiconductor radiation source comprises a laser diode which emits radiation having a wavelength in the range of about 350–400 nm.

20. The light source of claim 19, wherein the plurality of scattering particles are dispersed within the transmissive body to scatter the radiation emitted from the laser diode to reduce optical saturation effects and physical damage of the luminescent material.

21. The light source of claim 20, wherein the scattering particles comprise at least one of $TiO_2$ and $Al_2O_3$.

22. The light source of claim 19, wherein the at least one phosphor comprises:

$Y_2O_3:Eu^{3+}$, $Bi^{3+}$;

at least one of: $Ca_8Mg(SiO_4)_4Cl:Eu^{2+},Mn^{2+}$; $Ba_2SiO_4:Eu^{2+}$; and $(Ba,Sr)Al_2O_4:Eu^{2+}$; and at least one of: $(Ba,Sr,Ca)_5(PO_4)_3Cl:Eu^{3+}$; $BaMg_2Al_{16}O_{27}:Eu^{2+}$; and $BaMgAl_{10}O_{17}:Eu^{2+}$.

23. The light source of claim 19, wherein the transmissive body comprises at least one of a glass material, a plastic material, and a silicone material which encapsulates the laser diode.

24. The light source of claim 20, wherein the at least one luminescent material comprises at least one phosphor formed on a surface of the transmissive body.

25. The light source of claim 20, wherein the at least one phosphor comprises $Y_2O_3:Eu^{3+},Bi^{3+}$.

26. The light source of claim 20, wherein the at least one phosphor comprises $Ca_8Mg(SiO_4)_4Cl_2:Eu^{2+},Mn^{2+}$.

27. The light source of claim 20, wherein the at least one phosphor comprises $Ba_2SiO_4:Eu^{2+}$.

28. The light source of claim 20, wherein the at least one phosphor comprises $(Ba,Sr)Al_2O_4:Eu^{2+}$.

29. The light source of claim 20, wherein the at least one phosphor comprises $(Ba,Sr,Ca)_5(PO_4)_3Cl:Eu^{2+}$.

30. The light source of claim 20, wherein the at least one phosphor comprises $BaMgAl_{10}O_{17}:Eu^{2+}$.

31. The light source of claim 20, wherein the at least one phosphor comprises $BaMg_2Al_{16}O_{27}:Eu^{2+}$.

32. A method of producing light comprising the steps of:

generating radiation having a wavelength in a range of about 350–400 nm with a laser diode;

scattering the radiation with a plurality of scattering particles disposed around the laser diode; and converting at least a portion of the scattered radiation to a different wavelength with at least one phosphor.

33. The method of claim 32, wherein the scattered radiation is converted to white light.

* * * * *